United States Patent
Wyse et al.

(10) Patent No.: US 6,894,476 B2
(45) Date of Patent: May 17, 2005

(54) EFFICIENT COUPLER DETECTOR CIRCUIT WITH REDUCED HARMONIC DISTORTION

(75) Inventors: Russell Wyse, Center Pt, IA (US); Haki Cebi, Cedar Rapids, IA (US); Terry J. Shie, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 26 days.

(21) Appl. No.: 10/439,476

(22) Filed: May 15, 2003

(65) Prior Publication Data

US 2004/0227502 A1 Nov. 18, 2004

(51) Int. Cl.$^7$ ............................ G01R 23/04; H01P 5/12
(52) U.S. Cl. ................................... 324/95; 333/109
(58) Field of Search .............................. 324/95, 117 R, 324/126–128; 333/12, 26, 27, 109, 115, 116–128, 17.1–17.3, 32–33; 455/123–126, 127.1–127.3, 114.1–115.4; 342/22, 367, 375; 327/58; 330/127; 329/354

(56) References Cited

U.S. PATENT DOCUMENTS

| | | | | |
|---|---|---|---|---|
| 4,320,536 A | * | 3/1982 | Dietrich | 455/325 |
| 4,811,422 A | * | 3/1989 | Kahn | 455/114.1 |
| 5,467,013 A | * | 11/1995 | Williams et al. | 324/127 |
| 5,530,922 A | * | 6/1996 | Nagode | 455/126 |
| 5,963,087 A | * | 10/1999 | Anderson | 330/52 |
| 6,046,631 A | * | 4/2000 | Kitahara et al. | 329/354 |
| 6,108,351 A | * | 8/2000 | Hardy et al. | 370/491 |

* cited by examiner

*Primary Examiner*—Paresh Patel
(74) *Attorney, Agent, or Firm*—Farjami & Farjami LLP

(57) ABSTRACT

An exemplary coupler detector circuit comprises a coupler, a detector circuit, and a harmonic tank. The coupler has a transmission line electromagnetically coupled to a coupled line, and the coupled line has an isolated node and a coupled node. The transmission line may, for example, be a 50 ohm RF line for transmitting RF energy. The detector circuit is connected to the coupled node and is configured to detect a power transmitted along the transmission line. The harmonic tank is connected to the coupled node, and is configured to short to ground at least one harmonic signal transmitted along the coupled node.

20 Claims, 2 Drawing Sheets

EFFICIENT COUPLER DETECTOR CIRCUIT WITH REDUCED HARMONIC DISTORTION

BACKGROUND OF THE INVENTION

1. Field of the Invention

The present invention is generally in the field of power amplifiers. More specifically, the invention is in the field of power amplifier power detection.

2. Related Art

Various methods for detection the power output of a power amplifier are known. For example, in the coupler detector approach, a coupled line is electromagnetically coupled to a transmission line, and a detector circuit is connected to one node of the coupled line to detect the power output transmitted by a power amplifier along the transmission line.

A known problem with the coupler detector approach, however, is that harmonic signals can be generated by the detector circuit. These harmonic signals can be re-coupled onto the transmission line and introduce undesirable harmonic distortion into the transmission line, severely degrading the signal transmitted along the transmission line.

The conventional approach to reducing harmonic distortion in a coupler detector arrangement has been to provide a filter, such as a low pass filter, at the output node of the transmission line. This filter reduces the undesired harmonic signals generated by the detector circuit. However, the filter also adds loss to the signal path or "through path" along the transmission line. As a consequence, the efficiency of the power amplifier is significantly degraded, which is undesirable.

Accordingly, there is a strong need in the art for an efficient coupler detector circuit with reduced harmonic distortion. There is also a need in the art for a coupler detector circuit which does not reduce the efficiency of the power amplifier.

SUMMARY OF THE INVENTION

The present invention is directed to an efficient coupler detector circuit with reduced harmonic distortion. The invention overcomes the need in the art for a coupler detector circuit which does not reduce the efficiency of the power amplifier.

In one exemplary embodiment, a coupler detector circuit comprises a coupler, a detector circuit, and a harmonic tank. The coupler has a transmission line electromagnetically coupled to a coupled line, and the coupled line has an isolated node and a coupled node. The transmission line may, for example, be a 50 ohm RF line for transmitting RF energy. The detector circuit is connected to the coupled node and is configured to detect a power transmitted along the transmission line. The harmonic tank is connected to the coupled node, and is configured to short to ground at least one harmonic signal transmitted along the coupled node. For example, the at least one harmonic signal may be twice a fundamental frequency of a signal transmitted along the transmission line, and in other embodiments, the at least one harmonic signal is three times a fundamental frequency of a signal transmitted along the transmission line.

According to another embodiment of the invention, the harmonic tank comprises a band-pass filter. In this particular embodiment, the band-pass filter may have a resonant frequency equal to twice a fundamental frequency of a signal transmitted along the transmission line. The band-pass filter may also have a resonant frequency equal to three times a fundamental frequency of a signal transmitted along the transmission line. For example, the harmonic tank may comprises an LC circuit.

According to another embodiment of the invention, the detector circuit further comprises a diode, a resistor and a capacitor. In this particular embodiment, an anode of the diode is connected to the coupled node, a cathode of the diode is connected to a first end of the resistor at an output node, a second end of the resistor is connected to ground, a first terminal of the capacitor is connected to the output node, and a second terminal of the capacitor is connected to ground. With this arrangement, a voltage output generated at the output node corresponds to the RF energy transmitted along the transmission line, e.g., by a power amplifier.

According to another embodiment of the invention, the coupler detector circuit further comprises an impedance matching circuit connected to the isolated node. The impedance matching circuit may, for example, comprise a resistor and a capacitor.

According to various embodiments of the invention, harmonic distortion is significantly reduced along the signal path of the transmission line without adding loss to the transmission line. As a result, reduced harmonic distortion along the signal path of the transmission line is achieved in a significantly efficient manner. Other features and advantages of the present invention will become more readily apparent to those of ordinary skill in the art after reviewing the following detailed description and accompanying drawings.

DETAILED DESCRIPTION OF THE INVENTION

Figure 1:
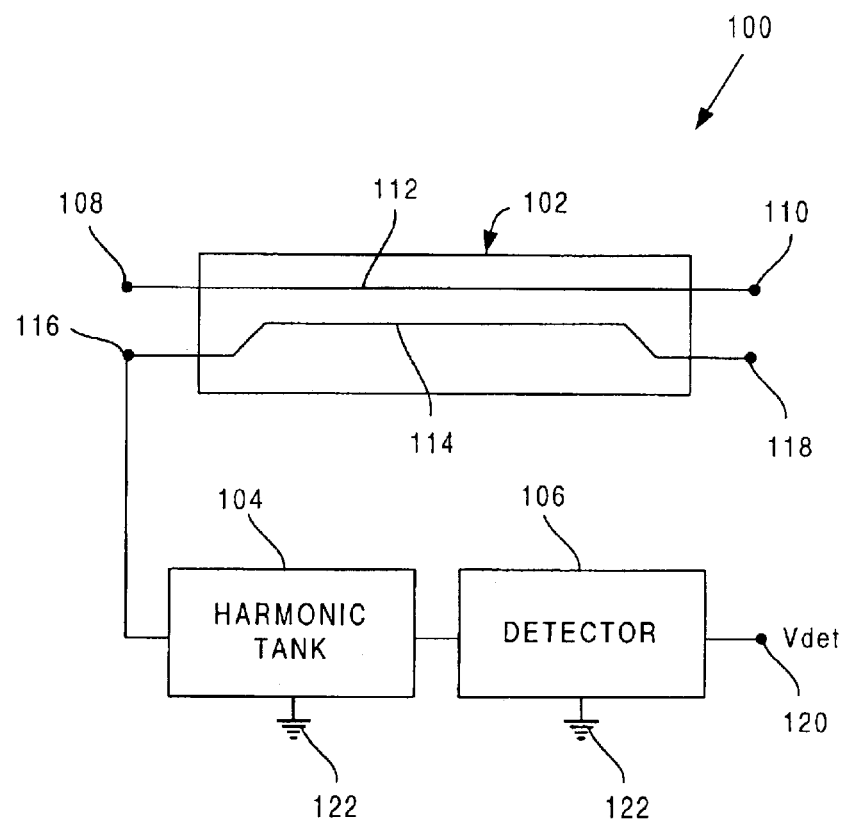
FIG. 1 shows a block diagram of a coupler detector circuit in accordance with one embodiment of the present invention.

The present invention is directed to an efficient coupler detector circuit with reduced harmonic distortion. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It is noted that, for ease of illustration, the various elements shown in the drawings are not drawn to scale.

Referring first to FIG. 1, there is generally shown a block diagram of coupler detector circuit 100 in accordance with one embodiment of the present invention. Coupler detector circuit 100 can be used in a wide number of applications, including wireless or radio frequency (RF) communications, such as mobile phones, for example, for providing power amplifier power detection with significantly reduced harmonic distortion and without reducing an amplifier's power added efficiency ("PAE").

Coupler detector circuit 100 comprises coupler 102, harmonic tank circuit 104 and detector circuit 106. Coupler 102 provides electromagnetic coupling between transmission line 112 and coupled line 114. Transmission line 112 can, for example, be a 50 ohm RF transmission line associated with an output stage of a power amplifier, and has RF input node 108 and RF output node 110. Coupled line 114 is electromagnetically coupled to transmission line 112, and has coupled node 116 and isolated node 118.

As shown in FIG. 1, detector circuit 106 is connected to coupled node 116 of coupled line 114 by way of harmonic tank circuit 104. Coupler 102 samples the RF energy transmitted along transmission line 112 onto coupled line 114. The sampled signals in coupled line 114 are then detected by detector circuit 106, and, in response, detector circuit 106 generates a voltage output ("Vdet") at node 120 from the sampled signals. Vdet 120 can then be used to determine the power output of the signals transmitted along transmission line 112.

Due to the arrangement shown in FIG. 1, the harmonic signals generated by detector circuit 106 are shorted to ground by harmonic tank circuit 104 to thereby reduce the harmonic distortion which would otherwise be introduced into transmission line 112 through coupler 102. Harmonic tank circuit 104 can, for example, be a band pass filter causing the fundamental frequency to pass while blocking the harmonics, such as the second, third, and fourth harmonics of the fundamental frequency of the signal from being transmitted. In accordance with the invention, at least one of the second, third, fourth, etc. harmonic signals generated by detector circuit 106 are blocked by harmonic tank circuit 104, although in other embodiments, two or more of the second, third, fourth, etc. harmonic signals generated by detector circuit 106 are blocked by harmonic tank circuit 104. As a result, the harmonic signals generated by detector circuit 106 are blocked and are prevented from being re-coupled to transmission line 112, thereby significantly reducing the introduction of harmonic distortion into transmission line 112 by detector circuit 106 and appreciably improving the quality of the signal path by way of transmission line 112.

Moreover, coupler detector circuit 100 does not add loss to the signal path along transmission line 112. As discussed above, the conventional solution to reducing harmonic distortion would be to include a low pass filter, e.g., at RF output node 110. However, introducing additional circuit components along transmission line 112, and in particular, at RF output node 110, results in significant loss to the signal path along transmission line 112 and results in a reduction of the PAE of the power amplifier. In contrast, coupler detector circuit 100 employs harmonic tank 104 connected to coupled node 116 of coupled line 114. As discussed above, this particular arrangement advantageously achieves reduced harmonic distortion by trapping undesired harmonic signals generated by detector circuit 106 so that the harmonic signal cannot be re-coupled onto transmission line 112 by way of coupler 102. Since harmonic tank circuit 104 is connected to coupled line 114 at coupled node 116, no loss to the signal path along transmission line 112 is added by coupler detector circuit 100. As a result, the efficiency of the power amplifier is maintained.

Figure 2:
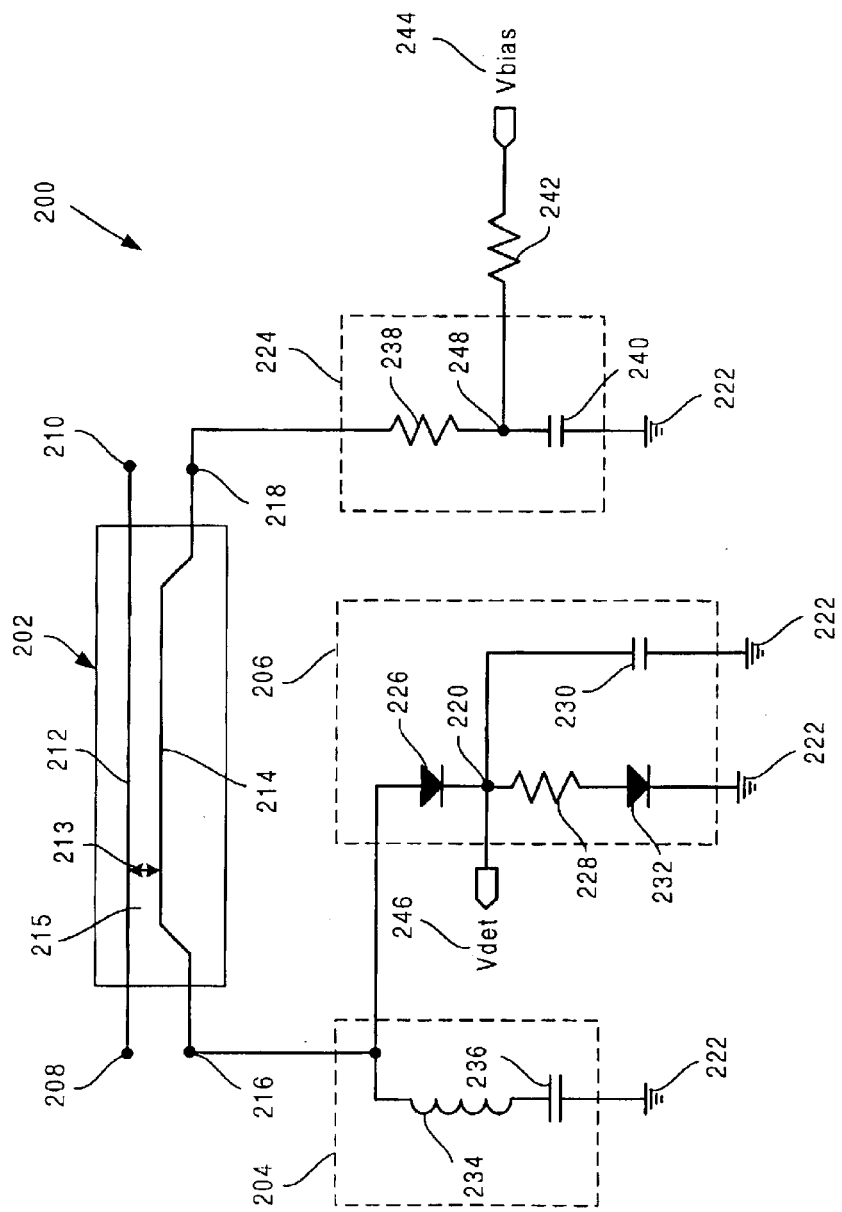
FIG. 2 shows a circuit diagram of a coupler detector circuit in accordance with one embodiment of the present invention.

Referring now to FIG. 2, there is shown a circuit diagram of coupler detector circuit 200 in accordance with one embodiment of the present invention. In accordance with the invention, coupler detector circuit 200 is configured to provide power amplifier power detection with significantly reduced harmonic distortion and without reducing an amplifier's PAE.

As shown in FIG. 2, coupler detector circuit 200 comprises coupler 202, harmonic tank circuit 204, detector circuit 206, and impedance matching circuit 224. Coupler 202 provides electromagnetic coupling between transmission line 212 and coupled line 214. By way of illustration, transmission line 212 and coupled line 214 can be separated by dielectric 215. In FIG. 2, distance 213 between transmission line 212 and coupled line 214 is approximately 3 to 4 microns. Transmission line 212 can, for example, be a 50 ohm RF transmission line associated with an output stage of a power amplifier, and has RF input node 208 and RF output node 210. Coupled line 214 is electromagnetically coupled to transmission line 212, and has coupled node 216 and isolated node 218.

Harmonic tank circuit 204 and detector circuit 206 correspond respectively to harmonic tank circuit 104 and detector circuit 106 in FIG. 1, and are connected to coupled line 214 at coupled node 216. As described more fully below, detector circuit 206 provides power amplifier power detection, and harmonic tank circuit 204 reduces harmonic distortion generated along transmission line 212, e.g., harmonic distortion generated by detector circuit 206, in an efficient manner. Detector circuit 206 comprises diode 226, diode 232, resistor 228 and capacitor 230. The anode of diode 226 is connected to coupled node 216, and the cathode of diode 228 is connected to node 220. A first end of resistor 228 is also connected to node 220, and a second end of resistor 228 is connected to the anode of diode 232. The cathode of diode 232 is coupled to ground 222. A first terminal of capacitor 230 is also connected to node 220, and a second terminal of capacitor 230 is coupled to ground 222. It is appreciated that diode 232 may be omitted in other embodiments (not shown), but is included in the particular embodiment depicted in FIG. 2, and functions to match the impedance of diode 226 and to compensate for temperature variations, thereby improving the accuracy of voltage output ("Vdet") 246 generated by detector circuit 206.

Continuing with FIG. 2, harmonic tank circuit 204 comprises an LC circuit including inductor 234 and capacitor 236. A first end of inductor 234 is connected to coupled node 216, and a second end of inductor 234 is connected to a first terminal of capacitor 236. The second terminal of capacitor is coupled to ground 222.

Impedance matching circuit 224 is connected to isolated node 218 of coupled line 214. More particularly, impedance matching circuit 224 comprises resistor 238 and capacitor 240. A first end of resistor 238 is connected to coupled line 214 at isolated node 218, and a second end of resistor 238 is connected to a first terminal of capacitor 240 at node 248. A second terminal of capacitor 240 is coupled to ground 222. In impedance matching circuit 224, resistor 238 and capacitor 240 are selected to provide an impedance which configures the electromagnetic coupling between transmission line 212 and coupled line 214. Resistor 238 can, for example, be approximately 50 ohms. Capacitor 240 functions to short to ground 222 any RF signals corresponding to the fundamental frequency at node 248.

A voltage bias (Vbias) input 244 is supplied through resistor 242 at node 248. As shown in FIG. 2, a first end of resistor 242 is coupled at node 244 to receive Vbias, and second end of resistor 242 is coupled at node 248. In the exemplary embodiment shown in FIG. 2, resistor 242 has substantially the same resistance as resistor 228 of detector circuit 206, although in other embodiments, resistors 228 and 242 can have different resistance values. For example, each resistor 228 and 242 can have a resistance of approximately 10 kilo ohms.

In operation, coupler 202 samples the RF energy transmitted along transmission line 212 onto coupled line 214. For example, the RF energy transmitted along transmission line 212 may be transmitted by a power amplifier. The sampled signals in coupled line 214 are then detected by detector circuit 206, and, in response, detector circuit 206 generates voltage output ("Vdet") 246 at node 220 from the sampled signals, where Vdet 246 corresponds to the RF energy transmitted along transmission line 212. Where there is no RF energy transmitted along transmission line 212, Vdet 246 will be approximately half the magnitude of Vbias 244 since resistors 242 and 228 form a voltage divider at node 220. As the RF energy transmitted along transmission line 212 increases, the magnitude of Vdet 246 will also increase due to the increased current drawn through coupled line 214, diode 226, resistor 228, diode 232 and capacitor 230 by coupler 202. The increased current through diode 226, resistor 228, diode 232 and capacitor 230 increases the rectified signal at node 220, and, thus, Vdet 246 at node 220 accurately corresponds to the RF energy transmitted along transmission line 212. Additional circuitry (not shown) can further be coupled to node 220 for generating a signal corresponding to Vdet 246 generated at node 220.

In the configuration of coupler detector circuit 200 shown in FIG. 2, harmonic tank circuit 204 operates as a band pass filter. For example, the values of inductor 234 and capacitor 236 may be selected so that harmonic tank circuit 204 has a band pass region (or resonant frequency) corresponding to the frequency of the second, third, fourth, etc. harmonic of the fundamental frequency of the signal transmitted along transmission line 212. In accordance with the invention, at least one of the second, third, fourth, etc. harmonic signals generated by detector circuit 206 are shorted to ground 222 by harmonic tank circuit 204. In other embodiments, two or more of the second, third, fourth, etc. harmonic signals generated by detector circuit 206 are shorted to ground 222 by harmonic tank circuit 204. Due to the operation of harmonic tank circuit 204, the harmonic signals generated by detector circuit 206 are shorted to ground 222 and are prevented from being re-coupled to transmission line 212. As a result, the introduction of harmonic distortion into transmission line 212 by detector circuit 206 is significantly reduced or eliminated, and the quality of the signal path by way of transmission line 212 is appreciably improved.

As discussed above, coupler detector circuit 200 does not add loss to the signal path along transmission line 212. As shown in FIG. 2, harmonic tank 204 of coupler detector circuit 200 is connected to coupled node 216 of the coupled line 214. This particular arrangement advantageously achieves reduced harmonic distortion by trapping undesired harmonic signals generated by detector circuit 206 so that the harmonic signal cannot be re-coupled onto transmission line 212 by way of coupler 202. Since harmonic tank circuit 204 is connected to coupled line 214 at coupled node 216, no loss to the signal path along transmission line 212 is added by coupler detector circuit 200. As a result, the efficiency of the power amplifier is maintained. Furthermore, due to the unique arrangement of coupler detector circuit 200, coupler detector circuit 200 can be inserted anywhere along transmission path 212, providing greater flexibility in architectural layout.

From the above description of exemplary embodiments of the invention it is manifest that various techniques can be used for implementing the concepts of the present invention without departing from its scope. For example, although a band pass filter has been used as a specific example of a harmonic rejection filter, other types of harmonic rejection filters, such as low pass filters or notch filters, can be used in an appropriate configuration to implement the concepts of the present invention. Moreover, while the invention has been described with specific reference to certain embodiments, a person of ordinary skill in the art would recognize that changes could be made in form and detail without departing from the spirit and the scope of the invention. For example, it is manifest that harmonic tank circuit 204 can be modified to short to ground two or more of the second, third, fourth, etc. harmonic of the fundamental frequency of the RF signal transmitted along transmission line 212 to further reduce the harmonic distortion along transmission line 212. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, an efficient coupler detector circuit with reduced harmonic distortion has been described.

What is claimed is:

1. A coupler detector circuit comprising:
    a coupler having a transmission line electromagnetically coupled to a coupled line, said coupled line having an isolated node end a coupled node;
    a detector circuit connected to said coupled node, said detector circuit configured to detect a power transmitted along said transmission line;
    a harmonic tank connected to said coupled node, said harmonic tank configured to block at least one harmonic signal transmitted along said coupled node and prevent said at least one harmonic signal from being re-coupled to said transmission line, thereby reducing harmonic distortion.

2. The coupler detector circuit of claim 1, wherein said at least one harmonic signal is twice a fundamental frequency of a signal transmitted along said transmission line.

3. The coupler detector circuit of claim 1, wherein said at least one harmonic signal is three times a fundamental frequency of a signal transmitted along said transmission line.

4. The coupler detector circuit of claim 1, wherein said harmonic tank comprises a band-pass filter, said band-pass filter having a resonant frequency equal to twice a fundamental frequency of a signal transmitted along said transmission line.

5. The coupler detector circuit of claim 1, wherein said harmonic tank comprises a band-pass filter, said band-pass filter having a resonant frequency equal to three times a fundamental frequency of a signal transmitted along said transmission line.

6. The coupler detector circuit of claim 1, wherein said harmonic tank comprises an LC circuit.

7. The coupler detector circuit of claim 1, wherein said transmission line comprises a 50 ohm RF line for transmitting RF energy.

8. The coupler detector circuit of claim 1, further comprising an impedance matching circuit connected to said isolated node, said impedance matching circuit comprising a resistor and a capacitor.

9. The coupler detector circuit of claim 1, wherein said detector circuit further comprises a diode, a resistor and a capacitor, an anode of said diode being connected to said coupled node, a cathode of said diode being connected to a first end of said resistor at an output node, a second end of said resistor being connected to ground, a first terminal of said capacitor being connected to said output node, a second terminal of said capacitor being connected to ground, a voltage output generated at said output node.

10. A coupler detector circuit comprising:
   means for coupling a coupled line to a transmission line, said coupled line having an isolated node and a coupled node;
   means for detecting the power transmitted along said transmission line, said means for detecting connected to said coupled node;
   means for shorting to ground at least one harmonic signal transmitted along said coupled node, said means for shorting connecting to ground at least one harmonic signal transmitted along said coupled node and preventing said at least one harmonic signal from being re-coupled to said transmission line, thereby reducing harmonic distortion.

11. The coupler detector circuit of claim 10, wherein said means for shorting to ground comprises a band-pass filter, said band-pass filter having a resonant frequency equal to twice a fundamental frequency of a signal transmitted along said transmission line.

12. The coupler detector circuit of claim 10, wherein said means for shorting to ground comprises a band-pass filter, said band-pass filter having a resonant frequency equal to three times a fundamental frequency of a signal transmitted along said transmission line.

13. The coupler detector circuit of claim 10, wherein said means for shorting to ground comprises an LC circuit.

14. A coupler detector circuit comprising:
   a coupler having a transmission line electromagnetically coupled to a coupled line, said coupled line having an isolated node and a coupled node;
   a detector circuit comprising a first diode, a first resistor and a first capacitor, wherein an anode of said first diode being connected to said coupled node, a cathode of said first diode being connected to a first end of said first resistor at an output node, a second end of said first resistor being connected to ground, a first terminal of said first capacitor being connected to said output node, a second terminal of said first capacitor being connected to ground, a voltage output generated at said output node;
   a harmonic tank connected to said coupled node, said harmonic tank configured to short to ground at least one harmonic signal transmitted along said coupled node and prevent said at least one harmonic signal from being re-coupled to said transmission line, thereby reducing harmonic distortion;
   an impedance matching circuit connected to said isolated node, said impedance matching circuit comprising a second resistor and a second capacitor, wherein a first end of said second resistor is connected to said isolated node, a second end of said second resistor is connected at a second node to a first terminal of said second capacitor, a second terminal being connected to ground;
   a bias voltage supplied to said isolated node through a third resistor and said second resistor, wherein a first end of said third resistor is connected to an input node to receive said bias voltage, a second end of said third resistor is connected to said second node.

15. The coupler detector circuit of claim 14, wherein said harmonic tank comprises a band-pass filter, said band-pass filter having a resonant frequency equal to twice a fundamental frequency of a signal transmitted along said transmission line.

16. The coupler detector circuit of claim 14, wherein said harmonic tank comprises a band-pass filter, said band-pass filter having a resonant frequency equal to three times a fundamental frequency of a signal transmitted along said transmission line.

17. The coupler detector circuit of claim 14, wherein said harmonic tank comprises an LC circuit.

18. The coupler detector circuit of claim 14, wherein said transmission line comprises a 50 ohm RF line for transmitting RF energy.

19. The coupler detector circuit of claim 14, wherein said first resistor and said third resistor have approximately the same resistive value.

20. The coupler detector circuit of claim 14, wherein said first capacitor is connected to ground through a second diode.

* * * * *